(12) United States Patent
Gauthier, Jr. et al.

(10) Patent No.: US 6,420,761 B1
(45) Date of Patent: Jul. 16, 2002

(54) ASYMMETRICAL SEMICONDUCTOR DEVICE FOR ESD PROTECTION

(75) Inventors: Robert J. Gauthier, Jr., Hinesburg; Steven H. Voldman, Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/233,797

(22) Filed: Jan. 20, 1999

(51) Int. Cl.⁷ .............................................. H01L 23/62
(52) U.S. Cl. ........................ 257/360; 257/408; 438/286
(58) Field of Search ................... 257/360, 347, 257/408, 379; 438/286

(56) References Cited

U.S. PATENT DOCUMENTS

| | | | |
|---|---|---|---|
| 5,173,755 A | 12/1992 | Co et al. | 257/361 |
| 5,281,841 A * | 1/1994 | Van Roozendaal et al. | 257/360 |
| 5,455,436 A | 10/1995 | Cheng | 257/356 |
| 5,489,792 A * | 2/1996 | Hu et al. | 257/347 |
| 5,539,233 A | 7/1996 | Amerasekera et al. | 257/362 |
| 5,565,790 A | 10/1996 | Lee | 326/30 |
| 5,594,611 A | 1/1997 | Consiglio et al. | 361/118 |
| 5,623,387 A | 4/1997 | Li et al. | 361/56 |
| 5,663,678 A | 9/1997 | Chang | 327/566 |
| 5,701,024 A | 12/1997 | Watt | 257/360 |
| 5,719,733 A | 2/1998 | Wei et al. | 361/56 |
| 5,742,084 A | 4/1998 | Yu | 257/356 |
| 5,742,085 A | 4/1998 | Yu | 257/360 |
| 5,744,841 A | 4/1998 | Gilbert et al. | 257/360 |
| 5,780,897 A | 7/1998 | Krakauer | 257/368 |
| 6,015,992 A * | 1/2000 | Chatterjee et al. | 257/109 |
| 6,140,683 A * | 10/2000 | Duvvury et al. | 257/360 |

* cited by examiner

Primary Examiner—Mark V. Prenty
(74) Attorney, Agent, or Firm—Connolly Bove Lodge & Hutz, LLP; Mark A. Chadurjian, Esq.

(57) ABSTRACT

An asymmetrical ESD protection device and a method of production thereof are provided. A source region and a drain region are formed in a substrate. A gate is formed over the substrate between the drain and source regions. A compensating implant is formed under the source region. The compensating may either be an additional implant or an existing BR resistor well. The compensating implant extends deeper into the substrate than the drain region.

6 Claims, 5 Drawing Sheets

ASYMMETRICAL SEMICONDUCTOR DEVICE FOR ESD PROTECTION

FIELD OF THE INVENTION

The present invention relates generally to electronic integrated circuits, and more particularly, to an asymmetrical semiconductor device used to protect integrated circuits against potential damage which can be caused by electrostatic discharge (ESD) events for bulk CMOS and silicon-on insulator (SOI) technology.

BACKGROUND OF THE INVENTION

Integrated circuits are extremely sensitive to ESD pulses and are susceptible to physical damage and destruction from the high voltages and currents which can be generated by ESD events. ESD is a high voltage electric pulse of short duration which is usually caused by static electricity. ESD pulses normally originate from the handling of the integrated circuit during manufacture, assembly and installation. When an ESD pulse occurs on a transistor, the extremely high voltage of the ESD pulse can break down the transistor and can potentially cause permanent damage. Consequently, the input/output pads of an integrated circuit need to be protected from ESD pulses so they are not damaged.

Integrated circuits and the geometry of the transistors which comprise the integrated circuits continue to be reduced in size and the transistors are arranged closer together. A transistor's physical size limits the voltage the transistor can withstand without being damaged. Thus, breakdown voltages of transistors are lowered and currents capable of overheating components are more frequently reached by the voltages and currents induced by an ESD event. Additionally, recent advances in technology have produced devices which can fail at voltage levels lower than the triggering voltages of known ESD protection circuits. Thus, there is a need for improved ESD protection circuits with lower triggering voltages.

In order to have a robust ESD protection device, the device must be able to handle large currents during a short period of time, as an ESD pulse may be approximately 200 ns in duration. Currently, the trend in ESD protection devices is to use NFET based ESD devices operating under avalanche conditions. Graphs of current versus voltage for a typical NFET and for an asymmetrically NFET according to the invention are shown in FIG. 1. During an ESD event, the voltage rapidly increases until it reaches the triggering voltage. When the triggering voltage is reached, the NPN bipolar transistor beneath the MOSFET transistor turns on and the voltage is clamped at the sustaining voltage. Typical NFET devices have a low beta and low substrate resistance. These two characteristics result in the NFET devices having a high snap-back or trigger voltage and a high sustaining voltage, respectively. The high trigger voltage and high sustaining voltage provide a device with a high degree of reliability, but are not good characteristics for an ESD protection device. For ESD protection, the ESD device should trigger as early as possible, that is the trigger voltage should be as low as possible. The sustaining voltage should also be as low as possible. As the trigger voltage and the sustaining voltage decrease, the ESD device turns on at lower trigger voltages and $It_2$, that is the second breakdown current in the MOSFET, is increased, thus creating a more efficient ESD protection device.

SUMMARY OF THE INVENTION

A method and an apparatus thereof for increasing the second breakdown in a MOSFET to create an ESD robust device is provided for both bulk CMOS, BiCMOS, RF CMOS and SOI technologies. An asymmetrical FET with a lower triggering voltage and lower sustaining voltage compared to known devices is achieved. In one embodiment of the invention, first and second diffusion regions of a standard type are formed in a substrate. A gate is formed over the substrate between the first and second diffusion regions. A non-self-aligned buried resistor (BR) well implant is provided under the first diffusion region. The resistor well implant extends deeper into the substrate than either the first or second diffusion regions, thereby forming an asymmetrical device. Additionally, an extension implant region may be arranged in either one or both of the diffusion regions. The resistor well implant is used as a compensating implant to make the NPN parasitic bipolar transistor more efficient, thereby increasing the device's beta.

In another embodiment of the invention, a source region and a drain region are formed in the substrate. A gate is formed over the substrate between the source and drain regions. A compensating implant region, implanted after the source/drain regions are formed, is arranged under the source region. The compensating implant region extends deeper into the substrate than either of the standard source and drain regions. Further to this embodiment, an extension implant region is preferably formed in at least one of the source and drain regions. The extension implant region extends from the source or drain region under the gate.

The ESD protection device of the first described embodiment can be created without an additional masking sequence, since the BR resistor well is implanted or otherwise formed prior to the first and second diffusion regions in the same areas. However, in the second described embodiment of the invention, an additional masking step may be necessary. In this case, the compensating implant is preferably implanted on the source side of the device at a predetermined angle after the source/drain implant on the device occurs. In a preferred embodiment, the asymmetrical ESD protection device is formed from a zero-Vt device. A zero-Vt device is also known as a natural device. Additionally, the extent to which the gate, the extension implant region and the compensating implant region overlap each other can be varied because the BR compensating implant mask is non-self-aligned to the gate structure in this embodiment.

The present invention provides an improved ESD protection device which can be easily made and requires the addition of only one mask or no additional masks. Moreover, the ESD protection device of the present invention has a high beta which leads to a lower sustaining voltage and a higher second breakdown current. Additionally, the trigger voltage of the device is lowered to provide protection at low trigger voltages.

DESCRIPTION OF THE INVENTION

Figure 1:
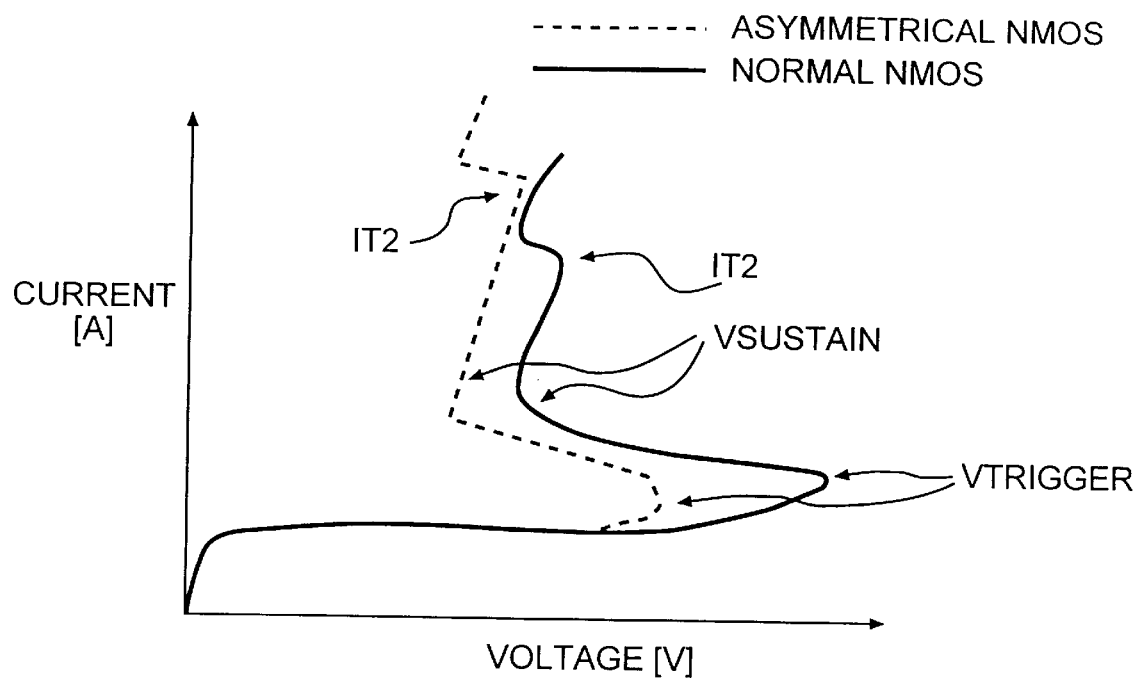
FIG. 1 is a graph of drain current versus drain to source voltage of a typical NFET and an NFET according to the invention.

The present invention provides a method and apparatus thereof for ESD protection. An asymmetrical FET is created in which one of the diffusion regions extends deeper into the substrate than the other diffusion region. This is accomplished by either providing a compensating implant region or using an existing BR resistor well as the compensating implant region. The compensating implant region counter dopes the halo implant which is usually provided at the diffusion regions and also increases the doping in an extension region. This decreases the base region slightly, but more importantly increases the effective depth of the extension region and eliminates the beta reduction caused by the halo implant. By raising the beta of the device, the sustaining voltage is lowered, resulting in a higher second breakdown current. By keeping the halo intact on the drain side, this keeps avalanche multiplication (M) high at the drain region and a lower trigger voltage is achieved, as shown in FIG. 1. Further, if the existing BR resistor well is used as the compensating implant, the device can be formed without any additional masks.

Figure 2:
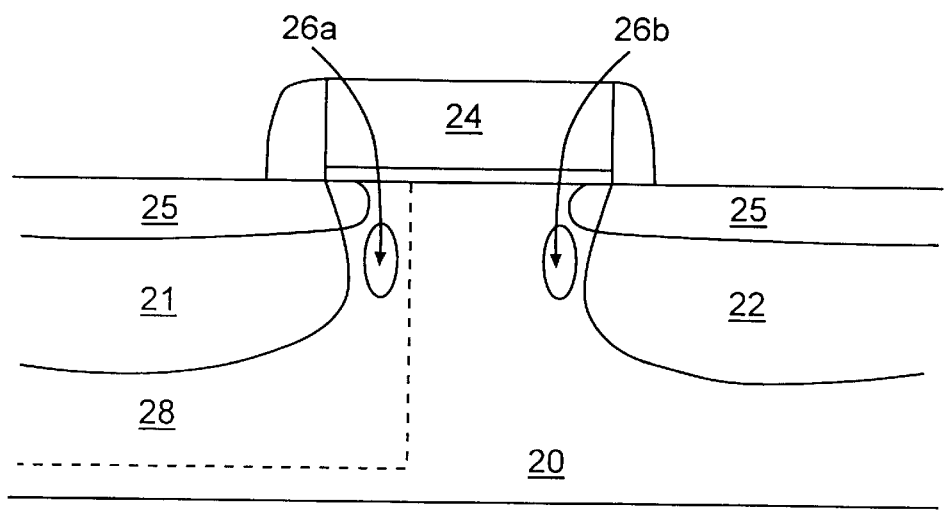
FIG. 2 illustrates an asymmetrical ESD protection device using a BR resistor well as the compensating implant.

Referring now to FIG. 2, an asymmetrical semiconductor device for ESD protection which uses the BR resistor well as a compensating implant is shown. First and second diffusion regions 21,22 are formed in the substrate 20. The diffusion regions may be used as the source and drain of the semiconductor device. A gate 24 is formed over the substrate 20 between the first and second diffusion regions 21,22. An extension implant region 25 is preferably also provided in at least one of the first or second diffusion regions 21,22. The extension implant region 25 is preferably lower doped than the first and second diffusion regions 21,22. Also, the extension implant region 25 has a shallower depth than the diffusion regions 21,22 and extends from the diffusion regions under the gate 24.

It is common in ESD protection devices to include halo implants 26a,b at either one or both of the diffusion regions which form the source and drain of the semiconductor device. The halo implants 26a,b are implants which have conductivity types opposite that of the first and second diffusion regions 21,22. The halo implants help to lower the avalanche breakdown voltage of the NFET ESD protection device. In the present case, the halo implant 26a at one of the diffusion regions, the first diffusion region 21 as shown in FIG. 2, is counter doped by the BR resistor well 28 which is used as the compensating implant. Preferably, the halo implant 26b at the other diffusion region, the second diffusion region 22 as shown, remains. This structure increases the avalanche multiplication at the second diffusion region 22, lowering the trigger voltage. Moreover, the BR resistor well 28 increases the effective depth of the extension region, eliminates the beta reduction caused by the halo implant 26 and increases the emitter depth. In turn, this increases the beta of the device leading to a lower sustaining voltage and a higher second breakdown current.

The device of FIG. 2 is a normal MOSFET which includes a BR resistor well 28 in which resistors are formed. The BR resistor well 28 is formed relatively early when making the semiconductor device, for example, before the source/drain implants or the gate is formed. Typically, when forming a semiconductor device, shallow trench isolation is first performed. Next, the n-well and p-well are formed. It is during this time that the BR resistor well 28 is formed. Compared with normal source/drain implants, which are formed self-aligned to the edge of the gate, the BR resistor well 28 is formed earlier in the process so that it can be placed virtually anywhere in the substrate. Thus, the BR resistor well implant 28 is not self-aligned. Additionally, the BR resistor well implant 28 is formed as deep as possible into the substrate 20, for example, preferably to a depth of approximately 0.4 microns, compared with a depth of 0.2 microns or less for normal source/drain implants. The doping concentration of a BR resistor well 28 to be used as a compensating implant should preferably be about $1\times10_{14}$ atoms/cm$^3$ or greater.

Figure 3:
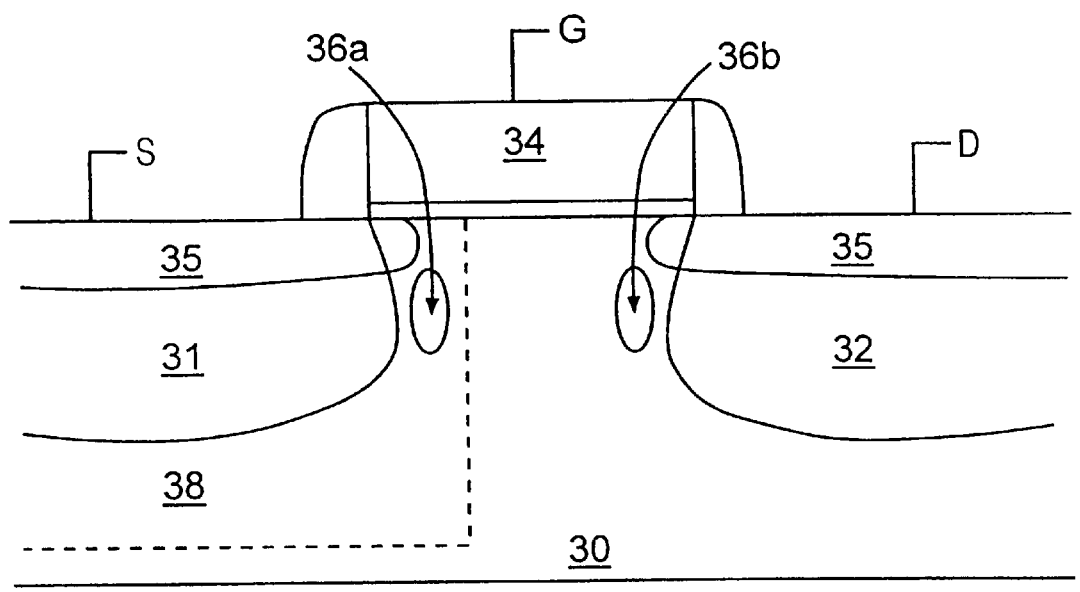
FIG. 3 illustrates an asymmetrical ESD protection deice with a compensating implant.

An asymmetrical semiconductor device for ESD protection with a compensating implant is shown in FIG. 3. The structure of this device is substantially the same as that shown in FIG. 2. Source 31 and drain 32 regions are implanted in the substrate 30. A gate 34 is formed over the substrate 30 between the source 31 and drain 32 regions. Extension implant regions 35 are formed in the source 31 and drain 32 regions. The extension implant regions 35 are preferably lower doped and shallower than the source 31 and drain 32 regions and extend from the source 31 and drain 32 regions under the gate 34. One difference between this embodiment of the invention and that shown in FIG. 2 is that here, there is no BR resistor well present. Therefore, a separate compensating implant 38 is provided. The compensating implant 38 is formed on the source side 31 of the device. The compensating implant 38 extends deeper into the substrate than either of the source/drain regions 31,32 or the extension implant regions 35. Preferably, the compensating implant 38 extends deeper into the substrate than the source/drain regions 31,32 by at least about 25%.

In the embodiment shown in FIG. 3, the compensating implant region 38 is formed after the source/drain implants on the device occur. Thus, the compensating implant 38 is preferably self-aligned with the gate 34. The compensating implant 38 may be an angled implant with a 4× rotation and a doping concentration preferably about $1\times10_{14}$ atoms/cm$^3$ or greater. Any angle of implantation can be used depending on how far the compensating implant is desired to extend under the gate. In the present case, as the compensating implant 38 is formed after the source/drain regions 31,32, the doping of the compensating implant 38 is done right on top of the halo implant 36a at the source 31 side of the device. This essentially saturates out the halo implant 36a, thereby counter doping the halo implant 36a on the source junction. Preferably, the halo implant 36b at the drain side 32 remains.

As discussed above, this structure results in a high p-doped material abutted against a high n-doped material at the drain causing high avalanche multiplication, which is desired at the drain side. However, this effect is not desired at the source side and the compensating implant counter dopes the halo implant at the source side and creates a deeper emitter for improved bipolar beta characteristics.

In a preferred embodiment, the asymmetrical ESD protection device is formed from a zero-Vt device. A zero-Vt device has a threshold voltage which is approximately zero. A zero-Vt device is very similar to a normal MOSFET. However, in a normal MOSFET, for example an NFET, a p-well is provided to create a threshold voltage. In a zero-Vt device, the p-well is not provided. Thus, the zero-Vt device has reduced well doping concentration, resulting in a higher beta. In turn, this reduces recombination in the base. Additionally, the low doping in the well creates the high substrate resistance necessary for a low trigger voltage.

Figure 5:
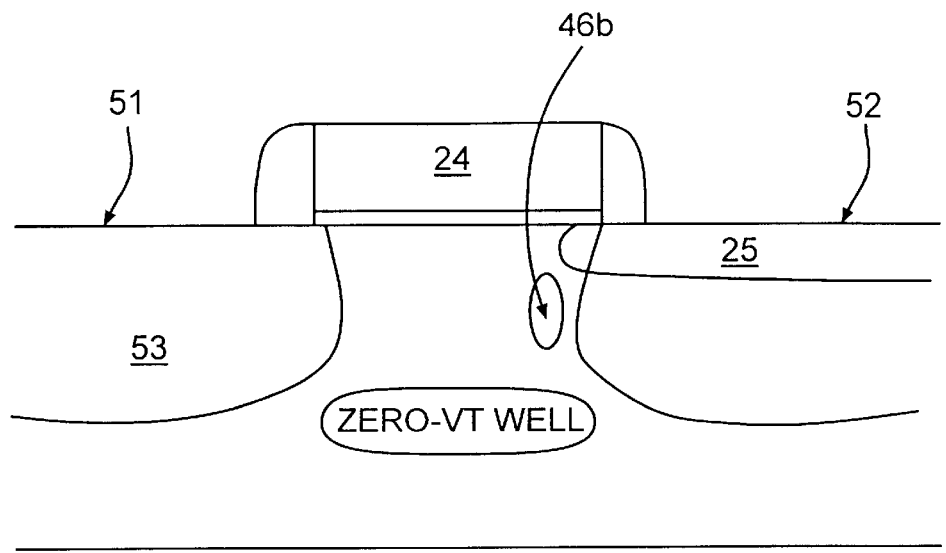
FIG. 5 illustrates an asymmetrical ESD protection device in a zero-Vt well.

By forming the BR resistor well or compensating implant on the source side 51 of the zero-Vt device, a deeper emitter 53 is achieved as shown in FIG. 5. This improves the emitter injection efficiency and makes the junction more one-directional. Hence, more electrons are injected from the source into the base, while at the same time, back injection from the base back into the source is prevented. Additionally, the zero-Vt device provides a higher beta and its advantages. Thus, a zero-Vt device formed with a compensating implant provides two advantages, a higher beta and a deeper emitter.

Figure 6:
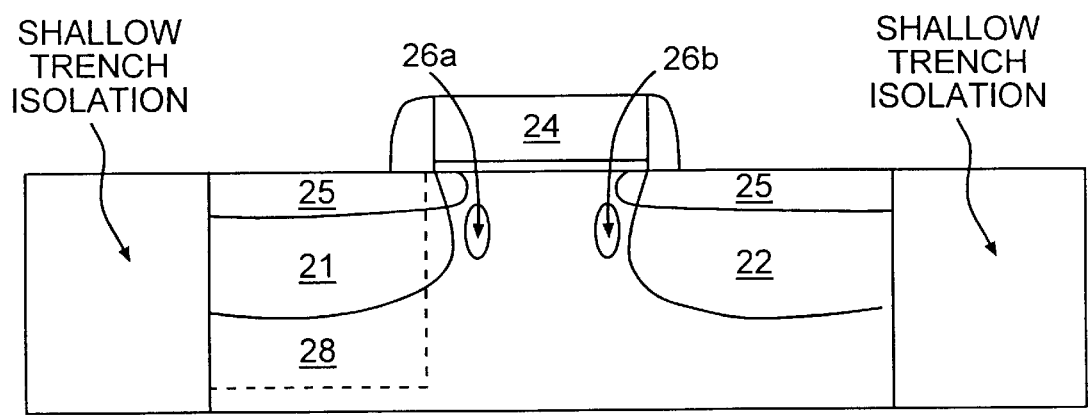
FIG. 6 illustrates an asymmetrical ESD protection device formed on a buried oxide.
Figure 7:
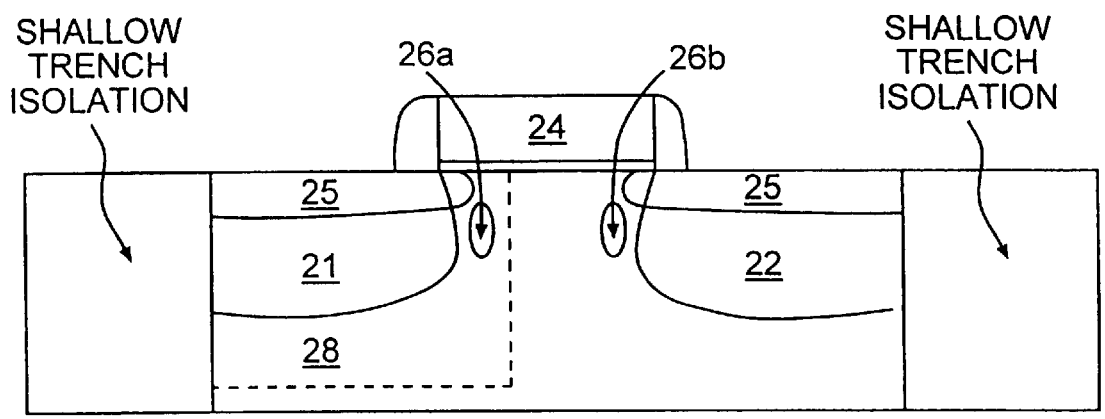
FIG. 7 illustrates the embodiment of FIG. 6 where the compensating implant extends over the extension implant.

The present invention can also be used in SOI applications. FIGS. 6 and 7 show an embodiment of the invention where the asymmetrical ESD protection device is formed on a buried oxide. FIG. 6 shows an embodiment in which the compensating implant is formed only over the source/drain and FIG. 7 shows an embodiment where the compensating implant is formed over the extension implant as well as over the source/drain.

Figure 8:
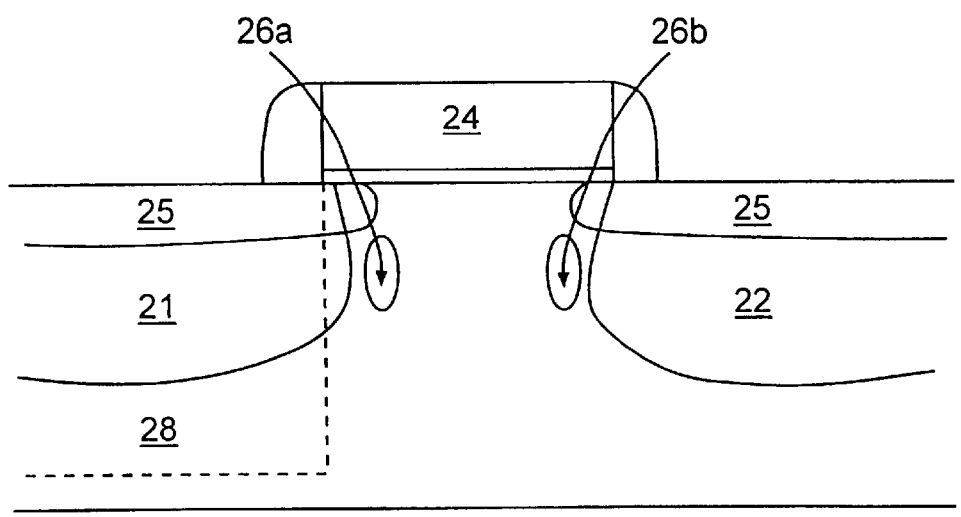
FIG. 8 illustrates an asymmetrical ESD protection device with the extension implant extending beyond the compensating implant.
Figure 9:
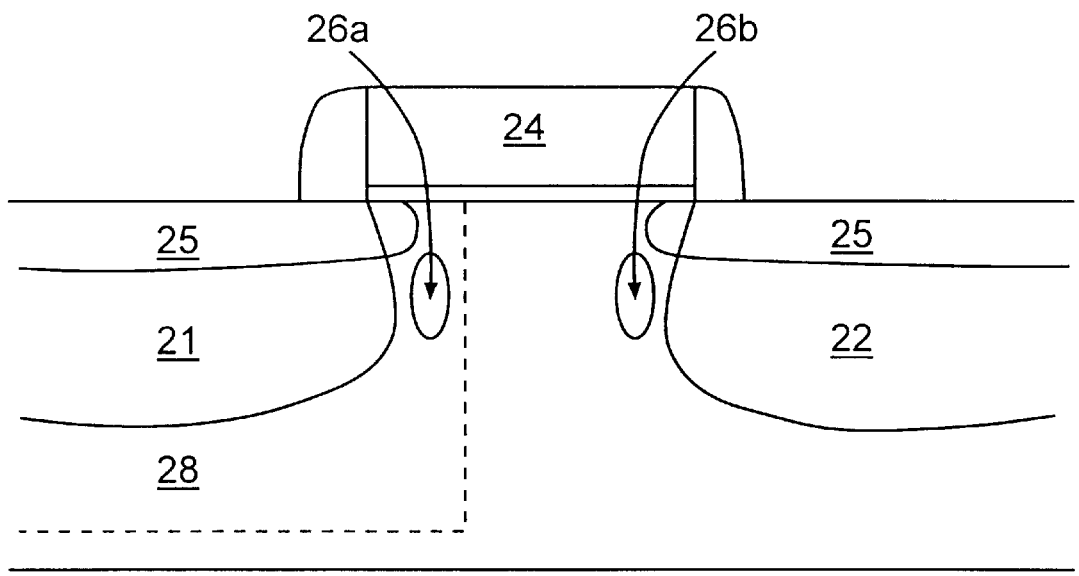
FIG. 9 illustrates an asymmetrical ESD protection device with the compensating implant formed beyond the extension implant.
Figure 10:
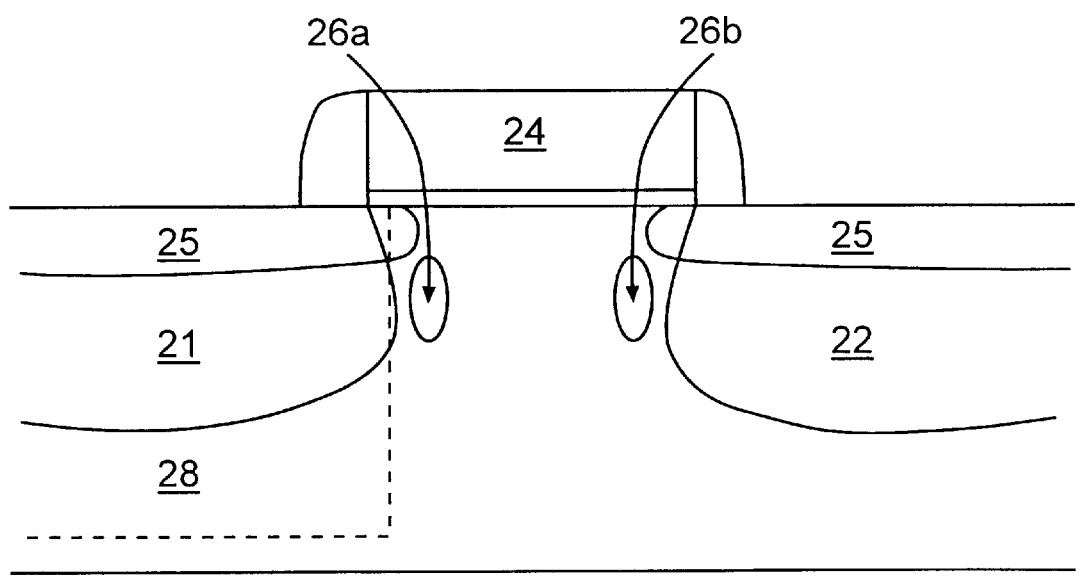
FIG. 10 illustrates an embodiment with the compensating implant formed only over the source/drain region.

FIGS. 8–10 show various embodiments of the invention in which the position of the compensating implant under the gate varies. For example, FIG. 8 shows an embodiment with the compensating implant extending under the gate beyond the source/drain, but not beyond the extension implant. FIG. 9 shows the compensating implant extending under the gate beyond both the source/drain implant and the extension implant. FIG. 10 shows an embodiment where the compensating plant extends only over the source/drain implant.

The extent that the compensating implant extends over the extension implant can affect the current carrying capability of the device. The deeper the junction/extension regions extend into the silicon, the lower the current density is for a given amount of applied current.

Figure 4:
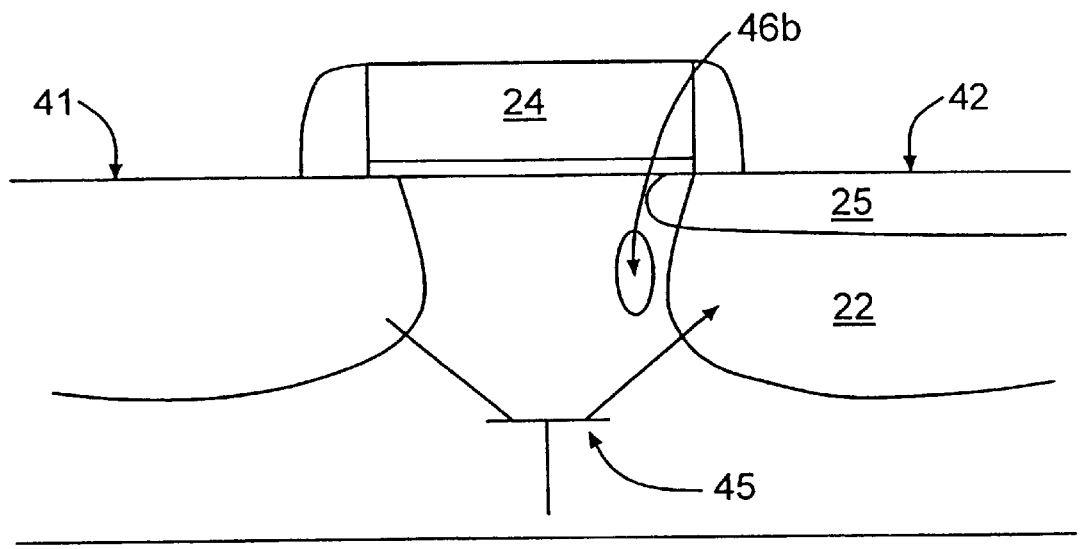
FIG. 4 illustrates an NFET with its parasitic NPN bipolar transistor.

The operation of the embodiments described above is substantially the same and will be described with reference to FIG. 4. A positive voltage is applied to the drain 42 of the device increasing the drain to source voltage, thus causing avalanche to occur at the drain/substrate junction. As was described above, the halo implant 46b preferably remains at the drain side 42 of the device, creating a more abrupt junction, which increases the avalanche multiplication which in turn lowers the trigger voltage. Once avalanche begins at the drain/substrate junction, the substrate/source junction needs to rise to the built-in voltage of the substrate/source junction to forward bias it. By using the zero-Vt device, the substrate resistance is high and it therefore requires less avalanche generation to forward bias the substrate/source junction. Moreover, by using the zero-Vt device, the built-in voltage will be slightly decreased as the built-in voltage is proportional to NA*NB. NB has been decreased due to the zero-Vt well.

Once the substrate/source junction is forward biased, the parasitic bipolar transistor 45 turns on and the drain to source voltage drops to a value necessary to sustain the parasitic bipolar transistor 45 on, that is, the sustaining voltage. It is desired to keep the sustaining voltage as low as possible. This is because the lower the sustaining voltage, the higher the second breakdown current of the device, as was discussed above. The value of the sustaining voltage is inversely proportional to the beta of the device. Thus, it is desired to have beta as high as possible. When the embodiment including a zero-Vt well is used, the gummel number is decreased thereby increasing the base transport factor and also the beta of the device, thereby providing an additional advantage.

Additionally, the asymmetrical design of the present invention increases the effective area of the emitter of the parasitic bipolar 45 since the extension region now extends deeper into the substrate due to the compensating implant, increasing the efficiency of the emitter. With the increased beta due to the high base transport factor and the high emitter efficiency, the beta of the device is increased thereby decreasing the sustaining voltage and increasing the second breakdown current.

Accordingly, a method and apparatus for creating a more robust ESD device has been provided. The trigger voltage of the device when operated in avalanche mode has been decreased and the sustaining voltage has been decreased, leading to a higher second breakdown current and lower trigger voltage for the device.

While a preferred embodiment of the invention has been described above, since variations in the invention will be apparent to those skilled in the art, the invention should not be construed as limited to the specific embodiment described above. For example, the device is described as formed on buried oxide or EPI wafers, however, any starting wafer can be used.

We claim:

1. An FET comprising:

a substrate;

first and second diffusion regions formed in said substrate;

a gate formed over said substrate between said first and second diffusion regions;

non-self-aligned resistor well implant arranged under said first diffusion region, said well implant extending deeper into said substrate than either of said diffusion regions; and an extension implant region formed in at least one of said diffusion regions, said extension implant region extending under said gate;

wherein said resistor well implant extends farther under said gate than said extension implant region.

2. An FET comprising:

a substrate;

first and second diffusion regions formed in said substrate;

a gate formed over said substrate between said first and second diffusion regions;

a non-self-aligned resistor well implant arranged under said first diffusion region, said well implant extending deeper into said substrate than either of said diffusion regions; and an extension implant region formed in at least one of said diffusion regions, said extension implant region extending under said gate;

wherein said resistor well implant extends the same distance under said gate as said extension implant region.

3. An FET comprising:

a substrate;

first and second diffusion regions formed in said substrate;

a gate formed over said substrate between said first and second diffusion regions;

a non-self-aligned resistor well implant arranged under said first diffusion region, said well implant extending deeper into said substrate than either of said diffusion regions; and an extension implant region formed in at least one of said diffusion regions, said extension implant region extending under said gate;

wherein said resistor well implant extends under said gate beyond said first diffusion region, but less than said extension implant region.

4. An FET comprising:

a substrate;

a source region;

a drain region;

a gate formed over said substrate between said source and drain regions;

a compensating implant region formed under said source region, said compensating implant region extending deeper into said substrate than either said source or said drain; and an extension implant region formed in at least one of said source and drain regions, said extension implant region extending under said gate;

wherein said compensation implant extends farther under said gate than said extension implant region.

5. An FET comprising:

a substrate;

a source region;

a drain region;

a gate formed over said substrate between said source and drain regions;

a compensating implant region formed under said source region, said compensating implant region extending deeper into said substrate than either said source or said drain; and an extension implant region formed in at least one of said source and drain regions, said extension implant region extending under said gate;

wherein said compensation implant extends the same distance under said gate as said extension implant region.

6. An FET comprising:

a substrate;

a source region;

a drain region;

a gate formed over said substrate between said source and drain regions;

a compensating implant region formed under said source region, said compensating implant region extending deeper into said substrate than either said source or said drain; and an extension implant region formed in at least one of said source and drain regions, said extension implant region extending under said gate;

wherein said compensating implant extends under said gate beyond said source, but less than said extension implant region.

* * * * *